(12) United States Patent
Chen et al.

(10) Patent No.: US 7,063,753 B1
(45) Date of Patent: Jun. 20, 2006

(54) ELECTRONIC DEVICE UTILIZING MAGNETIC NANOTUBES

(76) Inventors: Yingjian Chen, 1123 Wisteria Dr., Fremont, CA (US) 94539; Xiaozhong Dang, 789 Gallegos Ter., Fremont, CA (US) 94539

( * ) Notice: Subject to any disclaimer, the term of this patent is extended or adjusted under 35 U.S.C. 154(b) by 248 days.

(21) Appl. No.: 10/611,633

(22) Filed: Jul. 1, 2003

(51) Int. Cl.
*D01F 9/12* (2006.01)
*H01L 21/00* (2006.01)

(52) U.S. Cl. ............ 148/108; 977/750; 977/840; 977/888; 423/445 R; 423/447.1; 423/447.2; 210/695

(58) Field of Classification Search .......... 148/108; 210/695; 423/445 R, 447.1, 447.2; 977/DIG. 1, 977/750, 840, 888
See application file for complete search history.

(56) References Cited

U.S. PATENT DOCUMENTS

| 5,456,986 | A | 10/1995 | Majetich et al. | |
|---|---|---|---|---|
| 6,683,783 | B1 * | 1/2004 | Smalley et al. | 361/502 |
| 6,790,425 | B1 * | 9/2004 | Smalley et al. | 977/DIG. 1 |
| 6,946,410 | B1 * | 9/2005 | French et al. | 977/DIG. 1 |

OTHER PUBLICATIONS

J.Li, et al, Appl. Phys. Lett., vol. 75, p. 367, 1999.
W. Choi et al., Appl. Phys. Lett., vol. 79, p. 3696, 2001.
PH. Avouris, et al., Appl. Surface Science, vol. 141, p. 201, 1999.
K. Lafdi, et al., J. Appl. Phys., vol. 79, p. 6007, 1996.
Q. Zhan, et al., Phys. Rev. B. vol. 66, p. 134436, 2002.
P.G. Collins, et al., Scientific American, p. 62, Dec. 2000.

* cited by examiner

*Primary Examiner*—David A. Reifsnyder

(57) ABSTRACT

Present invention provides enabling techniques of integrating novel nanotube elements into semiconductor devices, particularly in transistors, as gate channels or/and as interconnects. This is done in a series of process steps, which consist of fabricating magnetic-core-containing nanotubes of selected size (diameter and length), filtration of nanotube powders, preparing nanotube precursor in aqueous chemicals to form colloidal solutions of proper concentration, dispersing nanotube-containing solutions onto wafer surface, and finally positioning nanotubes at desired locations by magnetic means to complete nanotube device structure. The key to this invention is to provide miniature nanotubes with tangible physical properties, in this case, magnetic properties, so that they can be aligned, filtered, and precisely directed to desired locations for device application. Such processes enable nanotubes to be compatible with typical semiconductor wafer processing technologies.

12 Claims, 6 Drawing Sheets

(a)

(b)

ELECTRONIC DEVICE UTILIZING MAGNETIC NANOTUBES

BACKGROUND OF THE INVENTION

1. Field of the Invention

The present invention relates generally to the field of semiconductor devices. More particularly, to the application of carbon nanotube in field effect transistors (FET), and the manufacturing method of producing mass quantity of such transistors at wafer level, while achieving precision positioning of carbon nanotubes as gate channels between source and drain, as well as interconnects.

2. Relevant Background

Carbon nanotube exhibits intriguing electronic properties that give rise to the possibility of being utilized in FETs. As a result of different quantum states depending on the size and chiral structure, nanotubes can behave as semiconductor whose conductivity may be changed by a factor of one million or more, comparable to the change in silicon FET. Because of its tiny size, the nanotube FET has potentially offer significantly lower power consumption, faster switching speed, and better reliability. Metallic nanotubes have the ability to carry a large current density of $10^9$ A/cm$^2$, which is 1000 times higher than the copper wire. This, along with the superior heat conductivity and temperature stability, make the nanotube one of the most attractive interconnect material at extremely miniature feature size.

In prior art, the functionality of a FET device was demonstrated with a nanotube randomly disposed between the source and drain electrodes. This is typically achieved by fabrication of source and drain electrodes using conventional semiconductor manufacturing process (photolithography and patterning), followed by random deposition of nanotubes on the same substrate, and relied on chance that a nanotube with the proper alignment would be found. Another alternative method that has been used in prior art is to deposit nanotubes on a substrate first. This is followed by pattern imaging and recognition using scanning electron microscopy, which was then used to guide the fabrication of contact leads around individual nanotube via e-beam lithography. Both of these techniques are not viable approaches of producing large quantity of nanotube-based devices. Both methods are disadvantageous because of the lack of control over the precise positioning and alignment of nanotubes with respect to the rest of device structure, and the lack of ability to select nanotubes of proper diameter and length.

In prior art, the methods of growing regular array of vertically oriented nanotubes have been shown. One of these methods involves controlled growth of carbon nanotubes on pre-patterned dots of catalysis. Deposition of nanotubes into channels of anodized aluminum has also been used. Both methods are limited to fabrication of vertically aligned nanotubes. They cannot be used to grow in-plane aligned nanotubes, which are required for transistor applications. There are also significant integration challenges between such preparation techniques and conventional semiconductor processing technology.

Therefore, there is a need in the art for a method of fabrication, selection, and integration of such carbon nanotubes into semiconductor electronic devices, such as FET, in particular.

SUMMARY OF THE INVENTION

The present invention addresses the above problems by providing methods of fabricating nanotubes of selected size (diameter and length), preparing nanotube precursor in aqueous chemicals to form colloidal solutions of proper concentration, dispersing nanotube-containing solutions onto wafer surface, and finally positioning nanotubes at desired locations to complete nanotube device structure.

It is difficult to sort or position conventional nanotubes for the purpose of device fabrication, due to their miniature size and physical properties, which result in the lack of means of maneuvering them. It is easier, however, to process articles with magnetic properties. For example, it is known that magnetic particles response to a magnetic field. They attract or repulse each other depending upon they carry the opposite or the same magnetic charges. Magnetic particles may be separated according to the difference in magnetic moment in response to a field gradient.

The first step of the invention is preparation of nanotubes with magnetic core. If the nanotubes are relatively long, such structure may be described as carbon (nanotube) coated magnetic nanowire. There are a number of ways to form such magnetic core-containing nanotubes. Carbon arc method or Pulse-Laser deposition using graphite rod packed with ferromagnetic metal or metal oxide may be used. Chemical vapor deposition (CVD) using metal-organic reactant may also be used. When it is combined with substrate of anodized Al with nano-pore structure, nanotubes with relatively well-defined length may be formed. Individual nanotube of such kind may be obtained by removing it from the Al/Al2O3 template by wet-etching. The patterned-template based process technique may be advantageous in producing relatively short nanotubes with sizes already defined within a certain range.

For long as-grown nanotubes, some further processing steps are required to tailor its length for device use. As a second step of this invention, a nano-grid technique is used to produce nanotubes of the length 50–150 nm range suitable for FET gate fabrication. A grid made of lines of conductive metals (Cu, Au, W, Al, Cr, etc). The width of the lines defines the required length of the nanotubes. The nanotubes, which are dispensed onto the grid surface, are first made to align perpendicular to the grid lines by applying a large aligning field in the same direction. Alternatively, the same can be achieved by scanning a row of Si tips over the grid surface, in order to mechanically align the nanotubes. This procedure is followed by the process to trim away the nanotube segments that lie in between the grid lines. This is done by using a current burning technique, or by oxygen plasma etch from the back of the grid surface, which the nanotubes adhere to.

Once the nanotubes of comparable sizes are made, a step of filtering using a magnetic field gradient is used to further narrow down the size distribution. Powders of magnetic nanotubes are made to pass through a magnetic gradient produced by a pair of large magnet. The field and field gradient is adjusted to suspend only the predetermined magnetic moment, and therefore the proper size of nanotubes. The magnetic nanotubes may exhibit superparamagnetic characteristics. They posses magnetic moment upon application of a magnetic field, and remain non-magnetic otherwise, which is desirable for keeping them from agglomeration.

The magnetically filtered nanotubes are made to suspend in aqueous chemicals with suitable surface chemistry and molecular weight, and surfactant additives to form colloidal solution. Such type of colloidal solution needs to have long shelf-life for storage, which might require constant agitation during storage. It is desirable that this type of solution has the optimal viscosity, and adhesion to silicon-based substrates, so that it can be spin coated onto substrate to form a thin layer of uniform coating, much like photoresist.

During the device fabrication, the nanotube-containing solution is spun onto the substrate (wafer) to form a thin layer of coating. The surface of the wafer contains structures that are made of magnetic materials, such as patterned hard magnetic pillars or bars. In order to attract and settle the magnetic nanotubes to their desirable locations, mechanical or/and magnetic agitation may be utilized.

BRIEF DESCRIPTION OF THE DRAWINGS

In FIG. 5(a), permanent or electromagnets are provided to apply a large magnetic field to magnetize the magnetic nanotubes. A pair of split coils is connected so as to have oppositely directed fields along the vertical direction. A tube that carries nanotube solution is provided in between the coils and the magnets. The carbon nanotubes are made to pass through the tube, while the filtered nanotubes of selected size come out from one side. In FIG. 5(b), a concentric distillation device with radial magnetic field and field gradient contains the nanotube mixture. It may be spun at high speed to induce separation of different sized nanotubes, which are then removed through various drainage outlets arranged in a series of radial positions.

DETAILED DESCRIPTION OF THE PREFERRED EMBODIMENTS

The purpose of present invention is providing enabling techniques of integrating novel nanotube elements into semiconductor devices, FET device in particular. This is done in a series of process steps, which consist of fabricating magnetic nanotubes of selected size (diameter and length), filtration of nanotube powders, preparing nanotube precursor in aqueous chemicals to form colloidal solutions of proper concentration, dispersing nanotube-containing solutions onto wafer surface, and finally positioning nanotubes at desired locations by magnetic means to complete nanotube device structure. The key to this invention is to provide miniature nanotubes with tangible physical properties, in this case, magnetic properties, so that they can be aligned, filtered, and precisely directed to desired locations for device application. Such processes enable nanotubes to be compatible with typical semiconductor wafer processing technologies.

Figure 1:
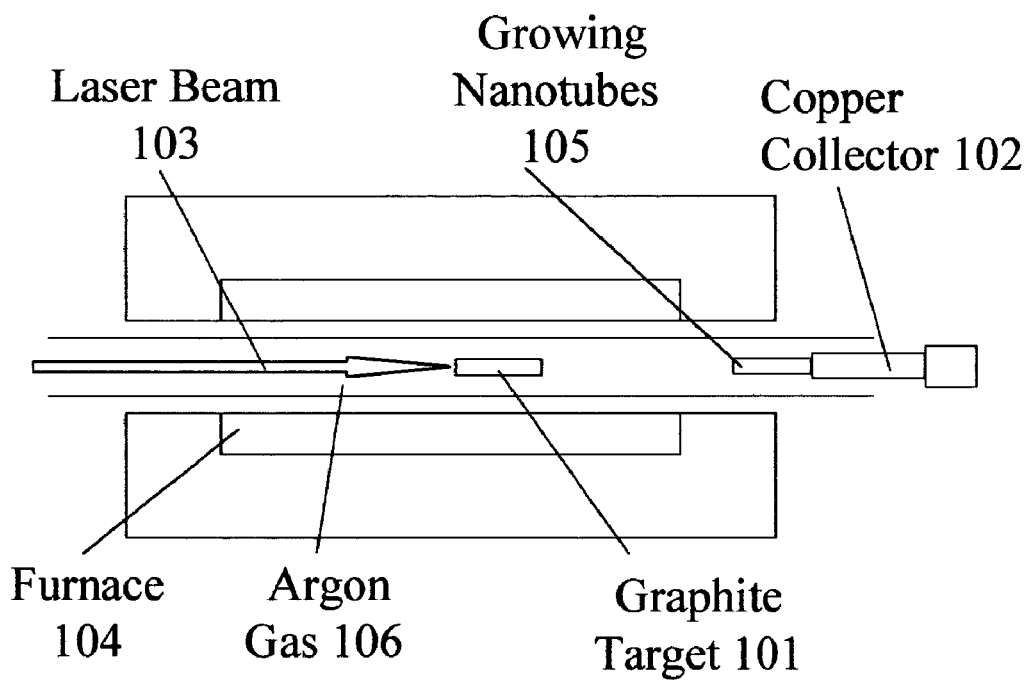
FIG. 1 illustrate one of the prior art methods of produce carbon nanotubes by pulse laser ablation. This method produces high percentage of single wall nanotube (SWNT). To produce nanotubes with magnetic core, the graphite target needs to be modified to include magnetic metal or metal oxide.

FIG. 1 shows one of the prior art techniques of producing carbon nanotubes by pulse laser ablation. A graphite rod 101 was blasted by intense laser pulses to produce hot carbon gas, which then condenses to form nanotubes, and subsequently deposited on the copper collector 102. The diameters of the nanotubes so produced vary with reaction temperature of the furnace 104. Relatively uniformly sized single-walled nanotubes can be produced by this technique. In order to make nanotubes with magnetic core, various magnetic metal or metal oxide may be packed into the graphite target. Another possible fabrication method, which is not shown, produces nanotubes by generating carbon plasma between two graphite rods.

Figure 2:
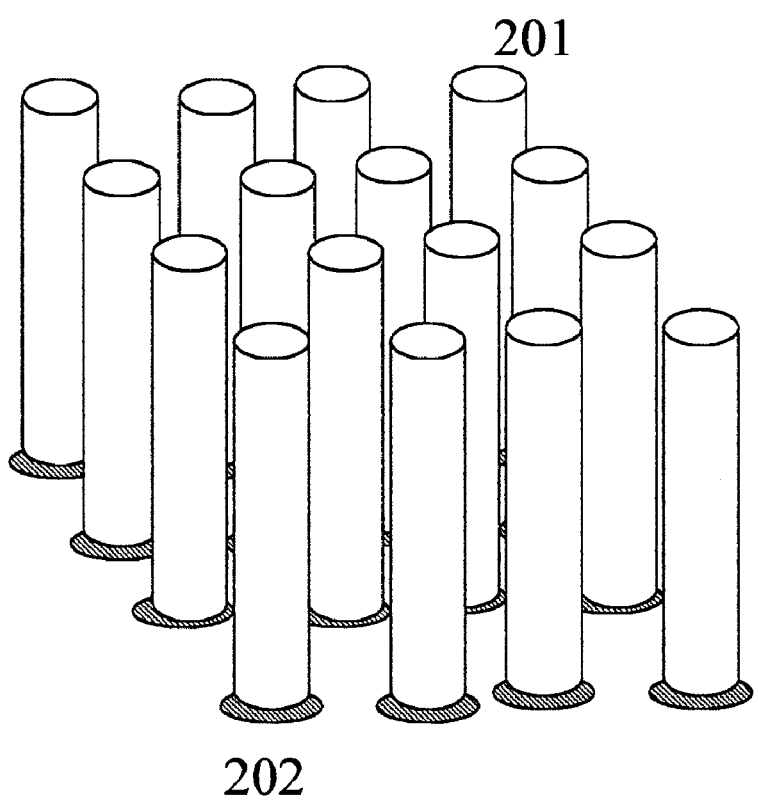
FIG. 2 shows vertically aligned carbon nanotubes produced by prior art method of growing nanotubes by chemical vapor deposition on patterns of catalyst particles on the substrate.

FIG. 2 shows an array of vertically aligned carbon nanotubes 201 produced a prior art method of chemical vapor deposition (CVD). There are at least two different ways of producing vertically aligned nanotubes. One of them uses substrate of anodized Al with nano-pore structure. Nanotubes are deposited by CVD onto such type of substrates at elevated temperatures. Nanotubes with relatively well-defined length may be formed. The second method is to grow nanotube on patterned particles of catalyst 202, such as those shown in FIG. 2. The patterned-template based process technique may be advantages in producing relatively short nanotubes with sizes already defined within a certain range. The purpose of both prior art techniques is to grow nanotube on substrates for direct device use. One of the embodiment of this invention is to grow carbon nanotubes, particularly magnetic carbon nanotubes by means already exist in the prior art. This step is followed by obtaining nanotubes of controlled sizes by removing them from the substrates for their initial grown. In the case of anodized Al substrate, nanotubes are obtained by wet-etching the Al/Al2O3 template. It may even be possible to magnetically extract the magnetic nanotubes from their nano-pore locations, if the adhesion strength is weaker than the magnetic force. In the case of direct growth nanotubes on catalyst, similar methods may also be used.

Figure 3:
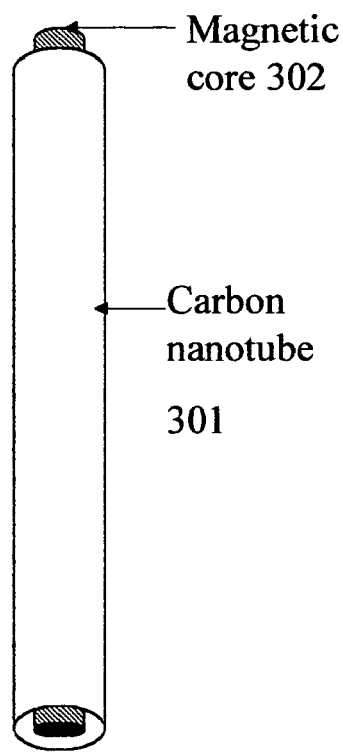
FIG. 3 shows nanotubes with magnetic core. It can also be viewed as a magnetic nanowire with a carbon sheath. Because of the tiny size (diameter of 1 nm) of the nanotube, the magnetic materials would most likely exhibit superparamagnetism. It does not have measurable moment without applied magnetic field. This helps to keep them separated under normal powder conditions during handling. The nanotubes produced by carbon arc or laser deposition techniques would be relatively long, as compare to those by chemical vapor deposition.

FIG. 3 shows structure of magnetic nanotubes. It can also be viewed as a magnetic nanowire 302 with a carbon sheath 301. Because of the tiny size (diameter of 1 nm) of the nanotube 301, the magnetic materials 302 would most likely exhibit superparamagnetism. The effective volume of such magnetic switching unit may be estimated by $V=A\lambda_{ex}$, where A is the inner cross-section area of the nanotube, $\lambda_{ex}$ is the exchange length of magnetic core materials. V is estimated to be on the order of 10–20 nm$^3$. By assuming anisotropy energy $K_u$ of $1\times10^6$ Joul/m$^3$, the value of $K_u V/kT$ is only about 2.5–5. If a high $K_u$ of $4\times10^6$ J/m$^3$ is used, this value is about 10–20. Such low stability factor would result in superparamagnetism of the magnetic nanotubes. It does not have measurable moment without applied magnetic field. This helps to keep them separated under normal powder conditions during handling. The nanotubes produced by carbon arc or laser deposition techniques would be relatively long, as compare to those by chemical vapor deposition.

Figure 4:
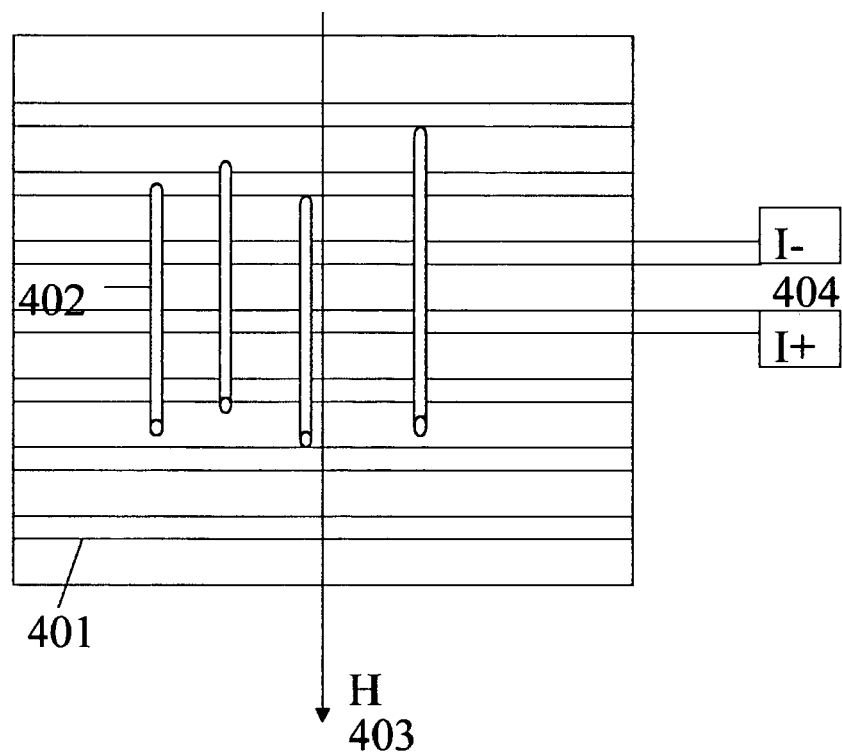
FIG. 4 shows carbon nanotubes dispersed onto a metal grid, which is used to tailor the length of nanotubes to the desirable value for FET device applications. After aligning the long nanotubes by application of a strong magnetic field, or by scanning array of tiny sharp tips along the alignment direction, nanotubes are aligned in perpendicular to the grid lines. The segments that lie in between the grid lines can be burned off upon applying electric current between neighboring grid lines. Alternatively, they can also be etched away in oxygen plasma using the grid line metals as masks.

FIG. 4 illustrates the method and apparatus of tailoring the nanotube size suitable for device use, especially in the case that the as-grown nanotubes are relatively long. A nano-grid technique is used in this case to produce nanotubes of the length 50–150 nm range suitable for FET gate fabrication. A grid, as shown in FIG. 3, is made of lines 401 of conductive metals (Cu, Au, W, Al, Cr, etc). The width of the lines determines the required length of the nanotubes. The nanotubes, 402 which are dispensed onto the grid surface, are first made to align perpendicular to the grid lines by applying a large aligning field 403 in the same direction. Alternatively, the same can be achieved by scanning a row of Si tips over the grid surface, in order to mechanically align the nanotubes. This procedure is followed by the process to trim away the nanotube segments that lie in between the grid lines. This may be done by using a current burning technique. A current or current pulse is applied between the neighboring grid lines 404. Initially the current passes through the nanotube segments that bridge between the grid lines, until a sufficiently large current burn them apart. The integrity of the grid lines 401 is maintained due to their much larger cross-section area, as compare to nanotubes 402. The nanotube segments that lie directly on top of the grid lines are preserved, since they experience no voltage drop. Alternatively a process of oxygen plasma etch may be used to remove the nanotube segments between the grid lines by etching from the opposite of the grid surface that the nanotubes adhere to. Previous studies showed that carbon nanotubes can be metallic or semiconducting, depending on their diameter and chiral angle. Conventional growth techniques generally yield a mixture of the above. The method described in this invention may be used to separate them. Since the semiconducting nanotubes would be burned at lower current as compare to the metallic nanotubes, the size of semiconducting nanotubes may be tailored without affecting the metallic nanotubes. The long metallic nanotubes with their original length can be easily filtered out, prior to the more refined filtration as described below.

Figure 5:
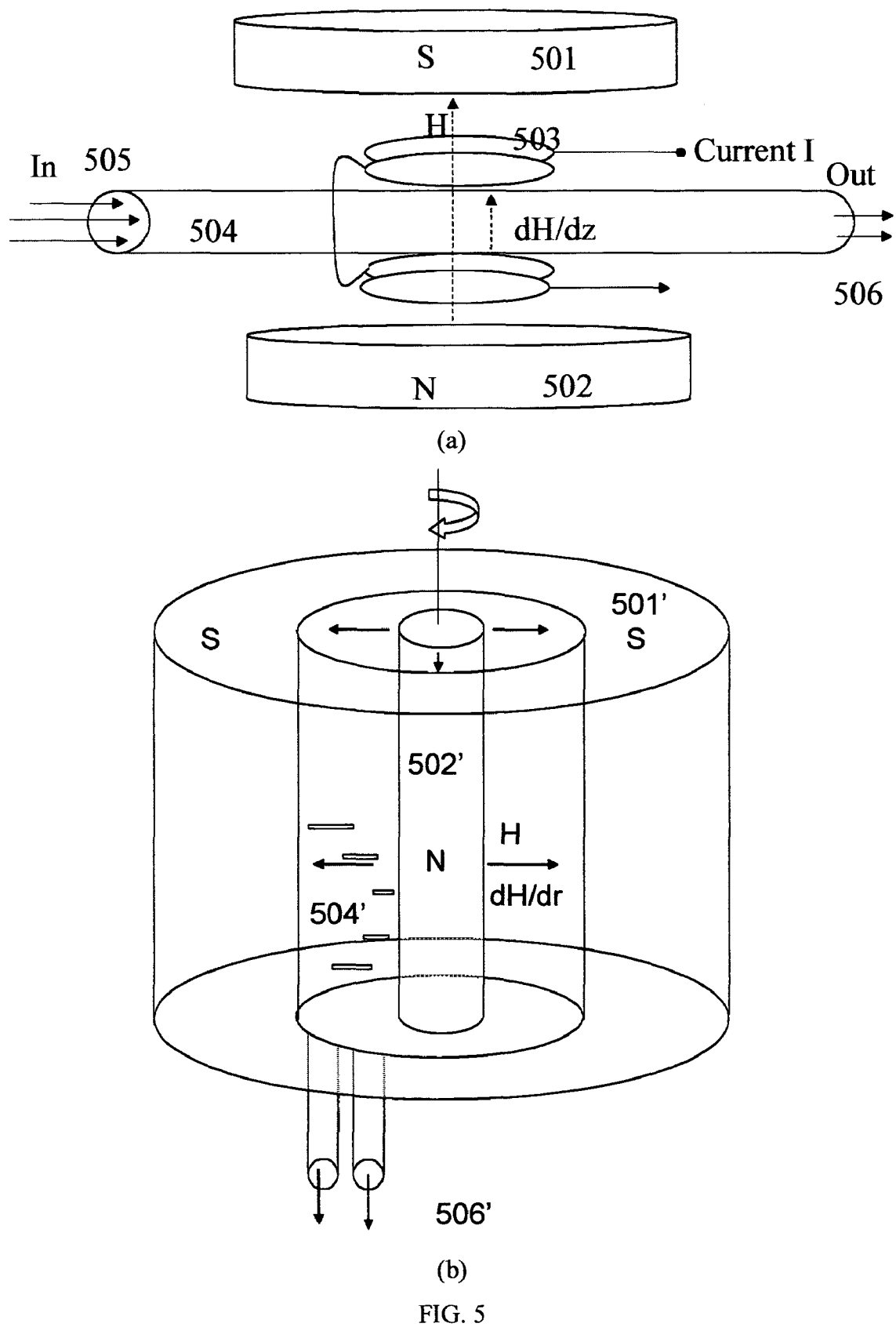
FIG. 5 illustrates examples of apparatus used for filtrating the nanotubes to select predetermined size.

FIG. 5 shows an apparatus for the purpose of nanotube filtration. Once the nanotubes of comparable sizes are made, either by growth of nanotubes using patterned template techniques, or by tailoring of long as-grown nanotubes, the filtration step could be used to further narrow down the size distribution. The magnetic nanotubes may exhibit superparamagnetic characteristics. They posses magnetic moment only upon application of a magnetic field, and remain non-magnetic otherwise. Superparamagnetism is desirable for keeping magnetic nanotubes from agglomeration. Powders of magnetic nanotubes are made to pass through a tube device. A set of permanent or electromagnet 501, 502 is provided to induce a large magnetic field to magnetize the magnetic nanotubes. A pair of split coils 503 is connected so as to have oppositely directed fields along the vertical direction. A tube 504 that carries nanotube powder or solution is provided in between the coils and the magnets. The carbon nanotubes 505 are made to pass through the tube, while the filtered nanotubes 506 of selected size come out from one side. The field and field gradient is adjusted to suspend only the nanotubes of predetermined magnetic moment, and thus the predetermined size of nanotubes. Assuming a magnetic moment of m ($\propto$ l) is induced by a field H in a superparamagnetic nanotube. It is also assumed that H is sufficient to reach magnetic saturation of the nanotube. The magnetic force that is experience by the nanotube in a magnetic field gradient is given by $F=m(dH/dz)$, which is proportional to the size of the nanotube. If the nanotube-carrying solution is made to pass the tube at a certain flow rate, only nanotubes of certain size is allowed to pass-through because of their suspension force. Nanotubes of all other sizes are trapped onto the tube walls, which can also be made weakly magnetic. Upon removal of magnetic field, those trapped species may be flushed out with a cleansing solution. Alternatively, nanotubes of different sizes may flow through the distillation pipe, separated into laminar layers, and are removed accordingly. In FIG. 5(b), another example of such distillation apparatus is shown. A concentric distillation device with radial magnetic field and field gradient contains the nanotube mixture 504'. It may be spun at a speed to induce separation of different sized nanotubes, which are then removed through various drainage outlets 506' arranged in a series of radial positions.

Figure 6:
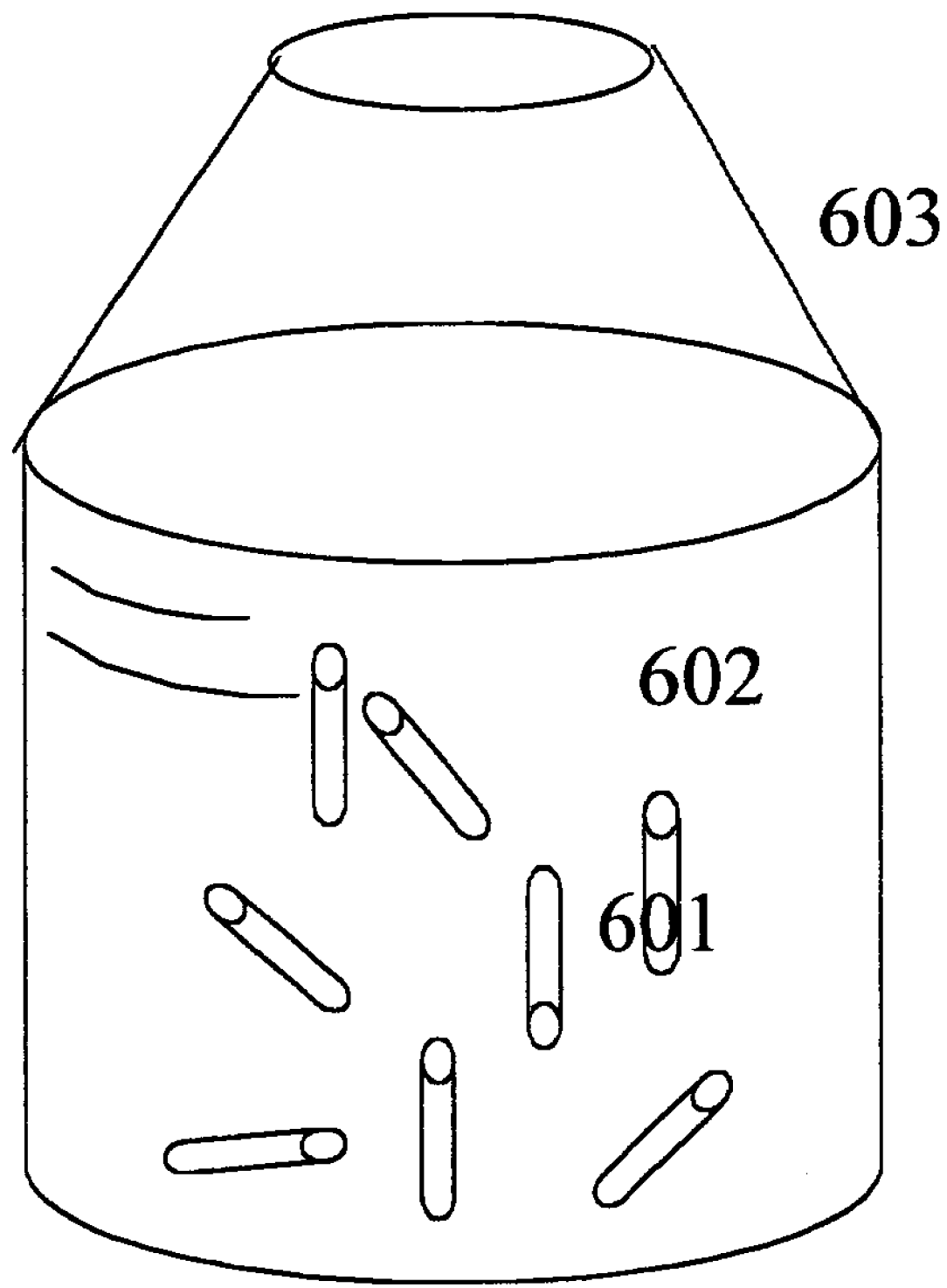
FIG. 6 shows nanotubes with tailored length are dispersed in aqueous chemicals to form colloidal solution. The solution is stored in a container which may be frequently agitated to avoid agglomeration.

FIG. 6 shows that the magnetically filtered nanotubes 601 are made to suspend in aqueous chemicals 602 with suitable molecular weight, and surfactant additives to form colloidal solution. Such type of colloidal solution needs to have long shelf-life for storage, which might require constant agitation during storage. It is desirable that this type of solution has the optimal viscosity, and adhesion to silicon-based substrates, so that it can be spin coated onto substrate to form a thin layer of uniform coating, much like photoresist. It is also desirable to achieve an optimal concentration of nanotubes in the colloidal solution, in order to provide, in average, certain population of nanotubes in the vicinity of each device. Higher than optimal concentration may result in agglomeration or the tendency of having excess number of nanotubes attached to the permanent magnet position guide, as described in the next paragraph. Less than optimal concentration, on the other hand, would result in difficulty of ensuring full occupancy of nanotubes at allocated sites. The nanotube concentration may be optimized based upon the device density on a wafer, as well as the spin coated solution thickness. Suitable surfactant additives may be used to prevent agglomeration, and sustain stable colloidal suspension via surface modification of carbon nanotubes.

Figure 7:
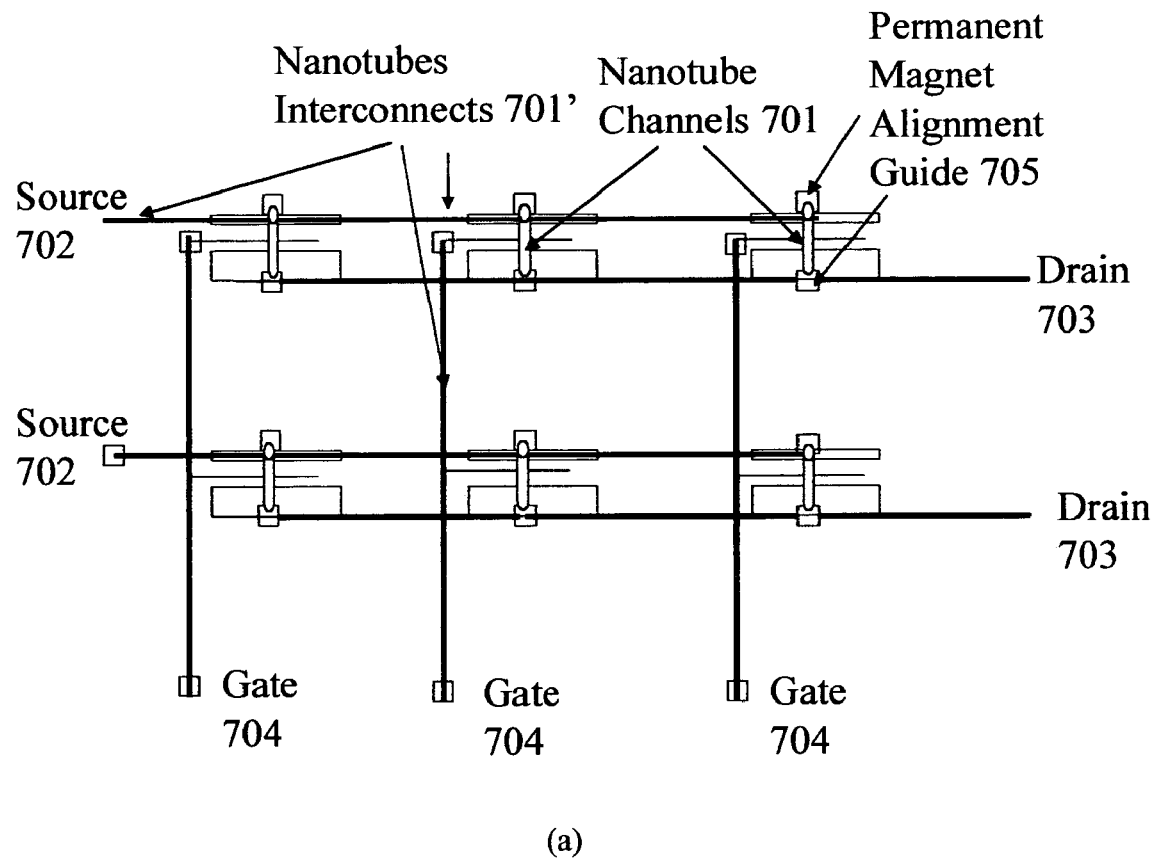
FIG. 7 illustrates 6 FET devices which contain nanotubes as their gate lines, as well as interconnects. There are nanotubes lie between and are electrically contacting source and drain electrodes. Also in FIG. 7, the interconnect lines made of metallic nanotubes are also shown. A pair of permanent magnetic elements is located at each FET device to guide the position of a magnetic nanotube.
Figure 7:
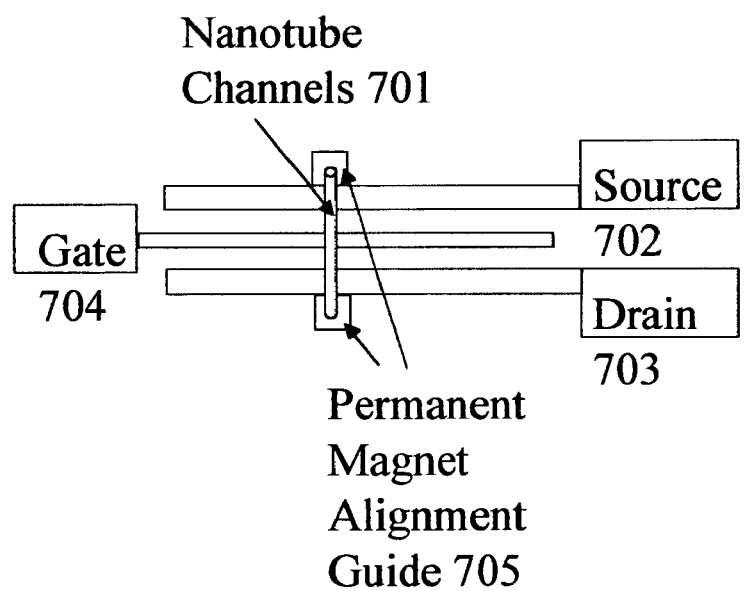

FIG. 7 illustrates a top view of several FET transistors during the fabrication stage. The nanotube-containing solution is first spun onto the substrate (wafer) to form a thin layer of coating. The surface of the wafer contains structures 705 that are made of magnetic materials, such as patterned hard magnetic pillars or bars. In order to attract and settle the magnetic nanotubes 701 and 701' to their desirable locations, mechanical or/and magnetic agitation may be utilized.

During this process, a constant or alternating magnetic field may be applied to magnetize the nanotubes. The magnetic nanotubes in the vicinity of the patterned permanent magnetic alignment guides (PMAG) possess certain mobility to swim to the energetically favorable locations, which are between the PMAGs. This type of mobility in nano-particle-like elements is analogous to the Brownian motion. A comparison may be made between the above-described method and the well-known Bitter map of magnetic field lines, since both techniques are used to position particles according to their magnetic surroundings.

Also shown in FIG. 7, the interconnect lines consist of nanotubes 701' are connected to the source 702, drain 703, and gate 704 of each device. During operation, the conductivity of the semiconductive nanotube 701 at the gate channel changes depending on the applied voltage on the gate electrode 704.

Figure 8:
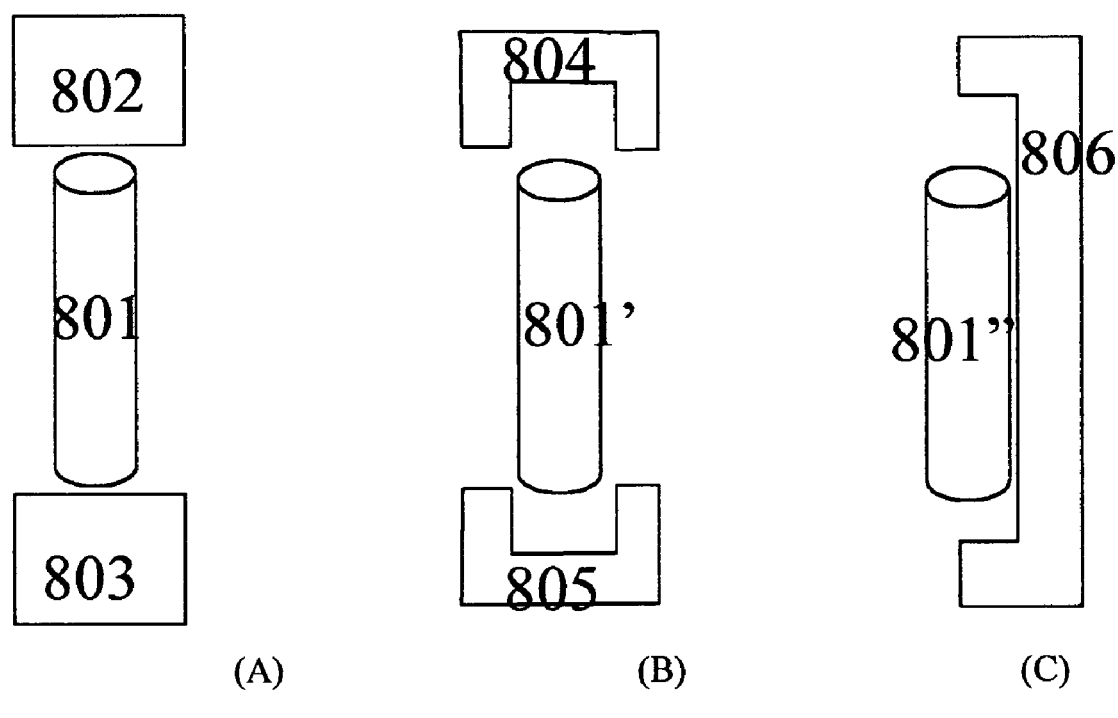
FIG. 8 shows some of the possible configurations of the permanent magnetic elements to effectively position and hold the magnetic nanotube at its desired location. (A) illustrates a pair of simple magnetized permanent magnetic dots. (B) shows a pair of U-shaped permanent magnetic elements. (C) shows a permanent magnetic bar, whose ends hold a nanotube.

FIG. 8 shows examples of possible configurations of the permanent magnetic alignment guide for attracting and holding the magnetic nanotube 801, 801', 801" at its desired location. FIG. 8(A) illustrates a pair of simple magnetized permanent magnetic dots 802, 803. FIG. 8 (B) is a pair of U-shaped permanent magnetic elements 804, 805. FIG. 8 (C) shows a permanent magnetic bar 806, whose ends hold a nanotube. These permanent magnetic elements are fabricated in some prior process steps, and are subsequently initialized using a strong magnetic field. The direction of this initialization is in the same direction of intended nanotube direction. The positive and negative magnetic charges between the space of the two elements create a stable low energy location for nanotube to be positioned at. The materials that are used for the elements have large coercive force and high magnetic moment. As a result, they are magnetically stable, and can generate sufficiently strong local magnetic field to attract magnetic nanotubes.

Although the invention has been described and illustrated with a certain degree of particularity, it is understood that the present disclosure has been made only by way of example, and that certain changes in the combination and arrangement of parts can be resorted to by those skilled in the art without departing from the spirit and scope of the invention, as hereinafter claimed. For example, the configuration and detailed design of the permanent magnetic alignment guide can be varied significantly to practice the invention as will be readily appreciated by those skilled in the art. Also the FET devices may incorporate semiconductive nanotubes as gate channels, and metallic nanotubes as interconnects, separately, or in combination.

The invention claimed is:

1. A method comprising:
   creating a plurality of nanotubes, the nanotubes each having a substantially cylindrical wall and a plurality of magnetic atoms that are attached to the wall;
   aligning the nanotubes on a grid having metal lines, such that each of the nanotubes has a first portion that overlaps a metal grid line and a second portion that does not overlap the metal grid line; and
   removing the second portions.

2. The method of claim 1, wherein creating the plurality of nanotubes includes arc discharge, laser evaporation or chemical vapor deposition.

3. The method of claim 1, wherein creating the plurality of nanotubes includes forming small cluster of magnetic atoms in the nanotube, such that the nanotube exhibits superparamagnetism at room temperature.

4. The method of claim 1, wherein creating the plurality of nanotubes includes forming a magnetic alloy containing cobalt, nickel or iron in the nanotubes.

5. The method of claim 1, wherein aligning the nanotubes on the grid includes applying a magnetic field of less than 2 Tesla.

6. The method of claim 1, wherein aligning the nanotubes on the grid includes scanning a row of sharp tips over the grid.

7. The method of claim 1, wherein removing the second portions includes applying a voltage between metal lines.

8. The method of claim 1, wherein removing the second portions includes etching the second portions with the grid as an etching mask.

9. The method of claim 1, wherein the grid having metal lines is made up of ferromagnetic materials.

10. The method of claim 1, wherein the length of nanotubes is longer than the spacing between two adjacent metal lines of the grid.

11. The method of claim 9, wherein aligning the nanotubes on the grid includes applying a magnetic field.

12. The method of claim 1, wherein aligning the nanotubes on the grid includes applying a magnetic field gradient.

* * * * *